(12) United States Patent
Solovyov

(10) Patent No.: US 11,877,521 B2
(45) Date of Patent: Jan. 16, 2024

(54) FLEXIBLE MULTI-FILAMENT HIGH TEMPERATURE SUPERCONDUCTING CABLE

(71) Applicant: Brookhaven Technology Group, Inc., Stony Brook, NY (US)

(72) Inventor: Vyacheslav Solovyov, Rocky Point, NY (US)

(73) Assignee: Brookhaven Technology Group, Inc., Stony Brook, NY (US)

( * ) Notice: Subject to any disclaimer, the term of this patent is extended or adjusted under 35 U.S.C. 154(b) by 937 days.

(21) Appl. No.: 16/620,636

(22) PCT Filed: Jun. 8, 2018

(86) PCT No.: PCT/US2018/036654
§ 371 (c)(1),
(2) Date: Dec. 9, 2019

(87) PCT Pub. No.: WO2018/227083
PCT Pub. Date: Dec. 13, 2018

(65) Prior Publication Data
US 2020/0194657 A1    Jun. 18, 2020

Related U.S. Application Data

(60) Provisional application No. 62/517,452, filed on Jun. 9, 2017.

(51) Int. Cl.
*H10N 60/01* (2023.01)
*H02G 15/34* (2006.01)
*H10N 60/20* (2023.01)

(52) U.S. Cl.
CPC ......... *H10N 60/0128* (2023.02); *H02G 15/34* (2013.01); *H10N 60/203* (2023.02)

(58) Field of Classification Search
CPC ......................... H10N 60/0128; H10N 60/203
See application file for complete search history.

(56) References Cited

U.S. PATENT DOCUMENTS

| | | | |
|---|---|---|---|
| 5,149,681 A | 9/1992 | Ohkawa | |
| 5,929,000 A * | 7/1999 | Hahakura | H01B 12/10 505/231 |
| 6,828,507 B1 | 12/2004 | Fritzemeier | |

(Continued)

FOREIGN PATENT DOCUMENTS

| | | |
|---|---|---|
| GB | 1288203 | 9/1972 |
| GB | 2498961 A | 8/2013 |
| JP | 8264039 | 10/1996 |

OTHER PUBLICATIONS

Van der Laan et al., Delamination Strength of YBCO Coated Conductors under Transverse Tensile Strength, Superconduct. Sci. Technol. 20, Jun. 21, 2007.

(Continued)

*Primary Examiner* — Paul A Wartalowicz
(74) *Attorney, Agent, or Firm* — Schroeder Law PC

(57) ABSTRACT

A multi-filament high temperature superconducting cable having improved AC current carrying capacity, quench resistance and flexibility. The multi-filament cable is formed from a plurality of stacked exfoliated filaments which provide current sharing between adjacent superconducting layers.

14 Claims, 13 Drawing Sheets

(56) References Cited

U.S. PATENT DOCUMENTS

| | | |
|---|---|---|
| 7,071,148 B1 | 7/2006 | Selvamanickam |
| 7,816,303 B2 | 10/2010 | Thieme |
| 8,044,752 B2 | 10/2011 | Otto |
| 8,437,819 B2 | 5/2013 | Takayasu |
| 8,731,629 B2 | 5/2014 | King |
| 2005/0009981 A1 | 1/2005 | Chen |
| 2008/0020304 A1 | 1/2008 | Schroder |
| 2008/0180202 A1 | 7/2008 | Otto |
| 2008/0236743 A1 | 10/2008 | Kye |
| 2009/0087234 A1 | 4/2009 | Roof |
| 2009/0233800 A1 | 9/2009 | Huang |
| 2009/0298696 A1* | 12/2009 | Otto ............... H10N 60/80 174/125.1 |
| 2010/0022396 A1 | 1/2010 | Otto |
| 2010/0184604 A1 | 7/2010 | Roden |
| 2012/0211475 A1 | 8/2012 | Oswald |
| 2012/0214675 A1 | 8/2012 | van der Laan |
| 2014/0155269 A1 | 6/2014 | Daibo |
| 2015/0200178 A1* | 7/2015 | Otremba ............... H01L 24/32 257/660 |
| 2015/0248952 A1 | 9/2015 | Ko |
| 2015/0251227 A1 | 9/2015 | Koelmel |
| 2016/0027555 A1 | 1/2016 | Nagasu |

OTHER PUBLICATIONS

Floegel-Delor et al., Operation and Experience of a 2 km Coated Conductor Reel-to-Reel Copper Pulse Plating Facility, Journel of Physics: Conference Series, 2014.

Maeda et al., Recent Developments in High-Temperature Superconducting Magnet Technology (Review), ISEE Transactions on Applied Superconductivity, vol. 40, No. 3, Jun. 2014.

Solovyov, et al., Exfoliated YBCO Filaments for Second-Generation Superconducting Cable, Superconducting Science and Technology, Nov. 15, 2016.

* cited by examiner

Exfoliated filament stack, substrate removed

2G filament stack, substrate incorporated

FLEXIBLE MULTI-FILAMENT HIGH TEMPERATURE SUPERCONDUCTING CABLE

This invention was made with government support under Contract No. DE-SC0013856 awarded by the Department of Energy. The government has certain rights in the invention.

BACKGROUND OF THE INVENTION

The present invention relates to high temperature superconductor materials and, more particularly, to a multi-filament high temperature superconducting cable having improved AC current carrying capacity, quench resistance and flexibility.

As will be understood by those skilled in the art, high temperature superconductor (HTS) materials can carry extremely large amounts of current with extremely low loss. HTS materials lose all resistance to the flow of direct electrical current and nearly all resistance to the flow of alternating current when cooled below a critical temperature. The development of HTS wires (the term "wires" as used herein is intended to include a variety of conductors, including tape-like conductors) using these materials promises a new generation of high efficiency, compact, and environmentally friendly electrical equipment, which has the potential to revolutionize electric power grids, transportation, materials processing, and other industries. However, a commercially-viable product has stringent engineering requirements, which has complicated the implementation of the technology in commercial applications.

In commercially-available second generation HTS wires, the HTS material is generally a polycrystalline rare-earth/alkaline-earth/copper oxide, e.g., yttrium barium-copper oxide (YBCO). The current carrying capability of the HTS material is strongly related to its crystalline alignment or texture. Typically, HTS materials are fabricated with a high degree of crystallographic alignment or texture over large areas by growing a thin layer of the material epitaxially on top of a flexible tape-shaped substrate. The HTS material is preferably fabricated so that it has a high degree of crystallographic texture at its surface. When the crystalline HTS material is grown epitaxially on this surface, the crystal alignment of the HTS material grows to match the texture of the substrate. In other words, the substrate texture provides a template for the epitaxial growth of the crystalline HTS material. Further, the substrate provides structural integrity to the HTS layer. In the current state of the technology, the substrate is an integral structural component of the commercially-available second generation HTS wires.

The substrate is typically made of highly resilient structural materials that may include refractory alloys based on nickel. Although the superconductor layer is only about 1 μm thick in these tapes, the substrate material and buffers can be as much as 100 to 150 μm thick. The typical width of the tape during manufacture is in the range of 40 mm wide. Depending on the intended application, this wide tape is then cut into smaller widths, typically from 10 mm down to about 4 mm, by mechanical slicing. Although even narrower strips are desirable in certain applications, the ability to cut narrower widths is limited due to damage caused to the integrity of the HTS tape by mechanical slicing tools.

FIG. 1 shows the construction of a commercially-available RABiTS-based 2G wire (product of AMSC Corp. marketed as Amperium wire), referred to herein as tape 100. Tape 100 includes an approximately 100 μm thick metal substrate 103. Substrate 103 is coated with an oxide buffer 102, which is formed from a sequence of layers of various oxides, for example yttrium oxide, yttrium-zirconium oxide and cerium oxide. Oxide buffer 102 is typically deposited by a vacuum deposition method, such as reactive sputtering or electron beam evaporation. A layer of yttrium barium copper oxide superconductor $ReBa_2Cu_3O_{7-x}$, referred to herein as superconducting layer 101, is grown on oxide buffer 102. In this commercially-available product, Re is a rare-earth metal, such as Y, Dy, Gd, Nd, and x is the oxygen index, with x<1. A protective silver layer 104 is deposited on top of superconducting layer 101 by magnetron sputtering. Finally, tape 100 is solder-plated with opposing top and bottom metal foils, forming stabilizing layers 105 and 107, respectively. The stabilizing layers 105, 107 are 1-2 mm wider than the remainder of the tape, so a pair of opposing solder fillets 106 are formed in order to join the two stabilizer foils.

Many practical applications of HTS, such as transformers, fault current limiters, energy storage magnets, magnets for fusion energy, and poles for rotating machinery, require high AC current carrying capacity and high mechanical flexibility to enable dense and uniform wrapping of the wire on a coilform or center core. Although the prior art discloses certain processes for manufacturing a cable from second-generation tapes, the disclosed cables still lack the necessary current carrying capacity and high mechanical flexibility for various applications. For example, U.S. Pat. No. 9,105,396 describes a process for manufacturing a twisted cable from a stack of 2G tapes, but because of the limited flexibility of the disclosed cable, the magnet is required to have a special hexagon shape to allow proper winding. For example, the limited flexibility of prior art wires made from stacked tape segments allows for a twisting pitch of no less than about 90 mm (Takayasu, M., L. Chiesa, P. D. Noyes, and J. V. Minervini, *Investigation of HTS Twisted Stacked-Tape Cable (TSTC) Conductor for High-Field, High-Current Fusion Magnets*. IEEE Transactions on Applied Superconductivity, 2017. 27(4): p. 1-5.).

An important aspect of any superconducting device is its resistance to a quench event. A quench event is a spontaneous transition of some part of the superconductor to a normal (non-superconducting) state. During a quench event, magnetic energy stored in the device is dissipated within a very small length, typically less than 100 μm. The associated temperature rise can be over 1000° C., which can destroy the superconducting material. Thus, existing HTS wires made from a tape having a single superconducting layer (such as Amperium tape from AMSC Corp) are prone to failure during a quench event. Likewise, HTS wires made from a plurality of stacked tape segments (e.g., the wires disclosed in U.S. Pat. No. 8,437,819) are also prone to failure during a quench event because the high level of contact resistance between the individual superconducting layers prevents/limits any current sharing between the separate layers. For example, the typical contact resistance (i.e., voltage drop per unit current density) for a prior art HTS wire including an oxide buffer layer is >100 $\mu\Omega cm^2$, a level which greatly exceeds the level which would allow current sharing between adjacent stacked tape segments.

There is therefore a need in the art for a HTS cable that provides improved AC current carrying capacity and flexibility for various applications, including dense and uniform wrapping. There is a further need in the art for a multi-filament HTS cable which allows current sharing between the separate superconducting layers such that the current passing through a superconducting layer experiencing a quench event can shift to and pass through adjacent superconducting layers thereby protecting the original superconducting layer from failure and/or destruction. There is a further need in the art for a method of joining two sections of a multi-filament HTS cable while maintaining the integrity of the cable.

SUMMARY OF THE INVENTION

The present invention, which addresses the needs of the prior art, provides a multi-filament HTS cable. Each filament includes a superconducting layer and a stabilizing metal layer in the absence of a substrate layer and a buffer layer. The filaments are preferably stacked upon each other. The adjacent filaments in the stack are in electrical communication with one another such that current can flow uninterrupted from the superconducting layer of one filament to the superconducting layer of an adjacent layer. In one preferred embodiment, the level of contact resistance between the adjacent filaments is below about 10 $\mu\Omega cm^2$, and more preferably below about 5 $\mu\Omega cm^2$. In one particularly preferred embodiment, the level of contact resistance between the adjacent filaments is below about 1 $\mu\Omega cm^2$. The stacked filaments are preferably twisted along the length thereof. The stacked filaments are preferably secured to one another. In one preferred embodiment, the stacked filaments are soldered to one another. One particularly preferred solder is Sn62Pb36Ag2. In one preferred embodiment, the low temperature solder layer has a thickness of less than approximately 20 µm. In another preferred embodiment, the stacked filaments are externally wrapped to secure such filaments to one another. In one preferred embodiment, the wrapping is a copper wire which may be tinned or insulated. In another preferred embodiment, the wrapping is a synthetic thread such as nylon. In still another preferred embodiment, the width of the filament is from about 0.1 mm to about 3 mm. In another preferred embodiment, the height of the stack is substantially equal to the width of the filaments. In another preferred embodiment, the twisting pitch is from about 5 mm to about 80 mm. In another preferred embodiment, a first metal foil is positioned on the top of the stacked filaments and a second metal foil is positioned on the bottom of the stacked filaments.

The present invention further relates to a method for manufacturing multi-filament HTS cable. The method includes the step of stacking a plurality of exfoliated filaments. The method includes the further step of securing the filaments to one another. In one preferred embodiment, the stacked filaments are soldered to one another. One particularly preferred solder is Sn62Pb36Ag2. In another preferred embodiment, the stacked filaments are externally wrapped to secure such filaments to one another. In one preferred embodiment, the wrapping is a copper wire which may be tinned or insulated. In another preferred embodiment, the wrapping is a synthetic thread such as nylon. The method includes the further step of axially twisting the stacked filaments. In one preferred embodiment, the axial twisting pitch is from about 5 mm to about 80 mm. In one preferred embodiment, the wrapping of the stacked filaments occurs prior to the twisting of the stacked filaments. In another preferred embodiment, the soldering of the stacked elements is performed after the twisting of the stacked elements. In one preferred embodiment, the method includes the additional step of positioning a first metal foil on the top of the stack filaments and positioning a second metal foil on the bottom of the stack filaments. The metal foil is preferably formed from copper, stainless steel or high carbon steel.

The present invention further relates to a method of splicing two HTS cables. The method includes the step of providing a first HTS cable formed by stacking a first plurality of exfoliated filaments. The method includes the further step of providing a second HTS cable formed by stacking a second plurality of exfoliated filaments. The method includes the further step of trimming the individual filaments in the first HTS cable in a step-like configuration to expose the stabilizing metal layers in each of the filaments. The method includes the further step of trimming the individual filaments in the second HTS cable in a corresponding step-like configuration to expose the stabilizing metal layers in each of the filaments. The method includes the further step of mating the trimmed filaments of the first HTS cable with the trimmed filaments of the second HTS cable. The method includes the further step of securing the first HTS cable to the second HTS cable. In one preferred embodiment, the method includes the further step of wrapping the first and second HTS cables in the area defined by the trimmed filaments. In another preferred embodiment, the method includes the further step of soldering the trimmed filaments of the first HTS cable to the trimmed filaments of the second HTS cable.

As a result, the present invention provides a multi-filament HTS cable that provides improved AC current carrying capacity and flexibility, as well as a method of manufacturing such cable. The present invention further provides a multi-filament HTS cable that allows current sharing between the individual superconducting layers such that the current passing through a superconducting layer experiencing a quench event can shift to and pass through adjacent superconducting layers thereby protecting the original superconducting layer from failure and/or destruction. The present invention further provides a method of joining two sections of multi-filament HTS cable while maintaining the integrity of the cable.

DETAILED DESCRIPTION OF THE INVENTION

Figure 1:
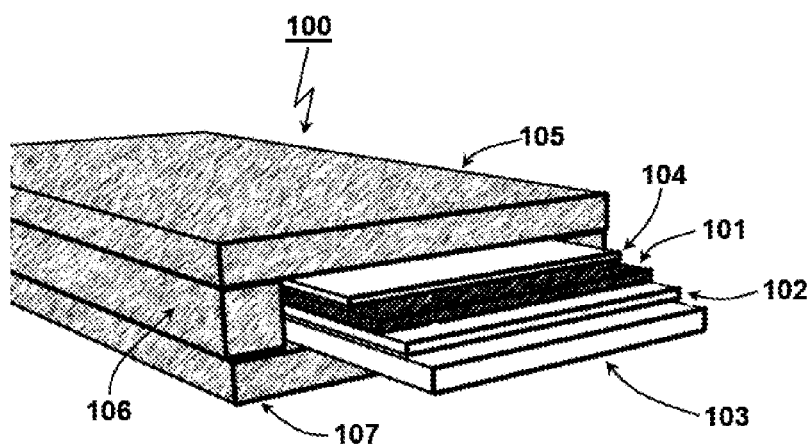
FIG. 1 is an illustrative view of the epitaxial layers in a commercially-available 2G wire.
Figure 2:
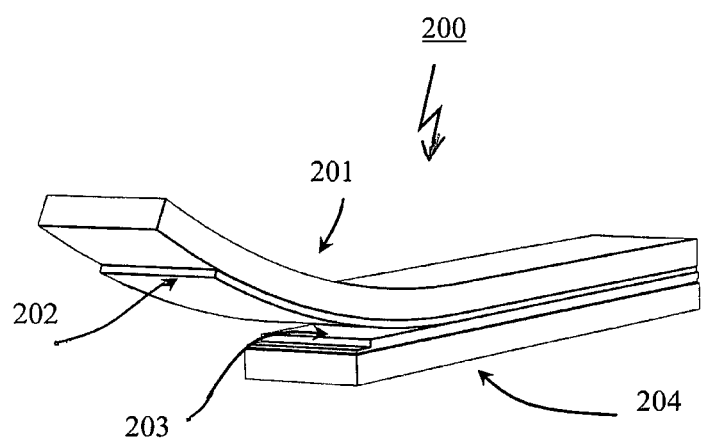
FIG. 2 is an illustrative view of a 2G wire where the substrate and buffer layers are partially separarated from the superconducting layer.

A partially exfoliated second generation (2G) wire, i.e., tape 200 is shown in FIG. 2. As described in detail in commonly-owned co-pending application PCT/US2017/014242, the disclosure of which is incorporated herein by reference, tape 200 includes a metal substrate 201, a buffer layer 202, a superconducting layer 203, and a stabilizing metal layer 204. The stabilizer layer 204 can be made of copper, stainless steel, bronze or another conductive metal. In a preferred embodiment, the tape is subjected to an external action, which increases the stress level between the superconducting layer 203 and the buffer layer 202. This external action can be accomplished by, for example, rapid heating by an external source, such as an inductive coil, infrared radiation or radio-frequency radiation or by rapid cooling, such as quenching in a cryogenic liquid, for example liquid nitrogen. The external action can also be accomplished by a mechanical deformation of the tape, such as bending. The stress level is preferably raised to a level where the substrate 201 and the buffer layer 202 can be mechanically separated from the superconducting layer 203 without damaging the latter in a process referred to as exfoliation.

Because the exfoliated HTS tape is ultra thin, it can be sliced by laser rather than mechanical tools. Stated differently, an HTS tape, which includes the substrate and buffer layers, is substantially thicker, and not suitable for cutting by laser. The laser-sliced HTS filaments preferably have a width of from about 0.1 mm to about 3.0 mm. Laser slicing reduces the waste that is caused by mechanical slicing, and greatly reduces the mechanical stress on the polycrystalline HTS material that accompanies mechanical slicing. Laser slicing is also capable of providing filaments with improved edge straightness to that accomplished by mechanical cutting (which tends to roll the edges of the tape as it is being cut). Additionally, mechanical cutting is known to introduce cracks in the superconducting layer due to bending of the tape edge. These cracks can produce a non-superconducting band (up to an approximately 300 μm wide) along the tape edge, thus reducing the effective cross section of the filament. These cracks can also propagate into the interior of the tape during usage of the tape. It is important to note that the HTS filaments that result from laser slicing of the tape do not include fillets or structural components along their edges. This unique filament architecture results in a very flexible wire with much tighter bending radius.

The narrow HTS filaments also facilitate the current carrying capability of the resultant cable. As will be appreciated by those skilled in the art, the transport current in a superconductor generates a magnetic field around the conductor, which is called the self-field. With an alternating transport current, the alternating self-field penetrates the superconductor during each current cycle. Even if there is no external magnetic field, the variation of the self-field inside the material causes a hysteresis loss, which is called self-field loss. The hysteresis or self-field loss can be reduced by decreasing the width dimension of the superconductor.

However, the current capacity of the superconductor is proportional to the width of the tape. Hence a 2 mm wide tape will carry about ⅕th the current of the 10 mm wide tape. So, although hysteresis losses are reduced by filamentizing, the current capacity is also reduced. This loss in width can be compensated for and addressed by stacking the filaments to provide a multi-filament cable. In one preferred embodiment, this multi-filament cable is wrapped in an insulating or high-resistance sheath that can provide interwinding insulation in a magnetic structure.

As mentioned, stacking filaments increases the current capacity of a given length of cable. However, in AC applications, the magnetic field of the stacked filaments will produce "shielding currents" in the stack that cause AC losses and will reduce the current carrying capacity. To reduce these losses, the stacked array of filaments is typically twisted along the axis of the cable. The twist reduces the shielding currents that would otherwise be generated and reduces the overall losses in the cable. A tighter pitch results in lower losses. The highly flexible filaments which are provided by exfoliation and laser slicing allow for significantly tighter pitches, and thus provide a structure with significantly lower overall loss due to shielding currents.

Figure 3A:
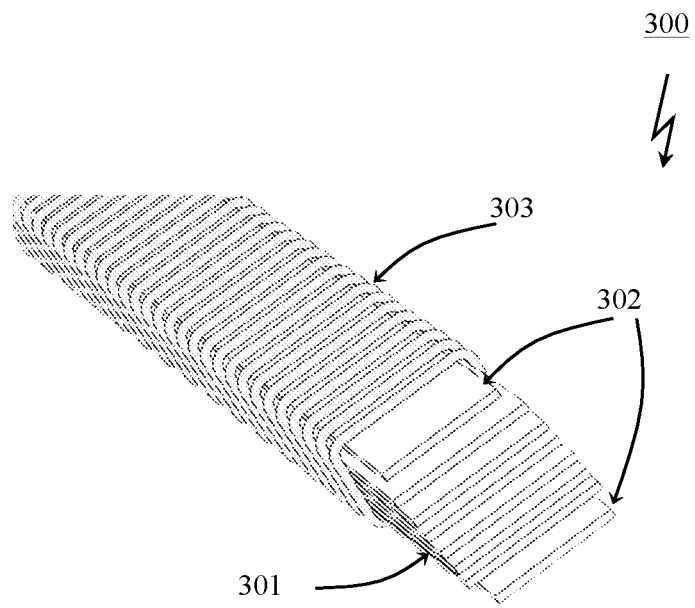
FIG. 3A is an illustrative view of a cable of the present invention showing a plurality of stacked exfoliated YBCO filaments, top and bottom metal foils, and a wire overwrap.

Referring now to FIG. 3A, the new HTS cable of the present invention is formed by stacking a plurality of exfoliated filaments 301. Each of these exfoliated filaments includes a superconducting layer and a stabilizing metal layer, but does not include a substrate layer or a buffer layer. A metal foil 302, e.g., copper, stainless steel or high carbon steel, is preferably positioned at both the bottom and top of the stack of filaments. The metal foils provide mechanical strength to the resultant cable structure. The material selected for the foil may vary depending on the intended purpose of the cable. The metal foil also provides added electrical stability to the cable. That is, in case of a quench event (i.e., transition to normal state), the current that was previously supported by the superconductor, will be diverted to the normal metal. The normal metal is also more effective at transferring heat away from the structure. Thus, the more normal metal that is in the cable, the greater the stability of the cable during a quench event. Of course, the addition of normal metal to the stack (for a given cross-sectional area) reduces the overall current carrying capacity of such cable. Nonetheless, this reduction in current carrying capacity may be justified in certain critical applications, such as Mill magnets, where a quench event is highly undesirable. The stack of exfoliated filaments and metal foils is then wrapped, for example with a wire 303. Wire 303 may be a metal wire, such as copper, nichrome, stainless steel or regular steel, or a synthetic polymer thread, such as nylon. The wrapping ensures intimate contact of the filaments, and additionally provides insulation between the winding layers in a magnet. In one preferred embodiment, the wire wrapping tension is at least about 10 N, and more preferably from about 10 N-100 N.

In a preferred embodiment, the exfoliated filaments 301 are coated with a low-temperature solder prior to stacking. The solder layer is thin, preferably <20 μm, such that the filament flexibility is not impaired. The preferred solder formulation provides good wetting of the filament surface, and at the same time, the solder coat should dissolve the silver coating by the amalgamation process. For example, Sn62Pb36Ag2 solder has demonstrated the required performance. It is has been discovered herein that the electrical connectivity between the filaments can be improved by reflowing the solder layer previously applied to the filaments. The solder reflow is preferably performed after the twisting of the stack. In this way, the individual filaments are free to slide during the twisting process. The stack is then heated to a temperature above the melting point of the low-temperature solder, which results in the melting of the low-temperature solder, and the flow of the molted solder into the gaps between the filament due to capillary action, and to the subsequent bonding of the adjacent filaments. In one preferred embodiment, the stack is heated to a temperature of approximately 185° C. for approximately 10 minutes. This soldering (or fusing) of the adjacent filaments provides a low resistance electrical connection between the adjacent filaments, thus allowing for an uninterrupted flow of current across the stack, i.e. current sharing. In one preferred embodiment, the individual filaments are fused after the cable has been wrapped and/or incorporated into a superconducting device. For example, the solder reflow can be accomplished by heating the item, such as the magnet coil, to a temperature higher than the melting temperature of the solder after the winding of the magnet coil with the cable. Alternatively, the reflow can be accomplished by localized heating of the stack during the winding process, either by an inductive coil or by a laser.

The current sharing between the superconducting layers in the cable is generally dependent on the contact resistance between the adjacent filaments. In one preferred embodiment, the level of contact resistance between the adjacent filaments is below about 10 $\mu\Omega cm^2$, and more preferably below about 5 $\mu\Omega cm^2$. In one particularly preferred embodiment, the level of contact resistance between the adjacent filaments is below about 1 $\mu\Omega cm^2$. In a more particularly preferred embodiment, the level of contact resistance between the adjacent filaments is below about 0.01 $\mu\Omega cm^2$. This inter-filament connectivity can be achieved through mechanical contact between adjacent stacked filaments, e.g., through the mechanical pressure exerted on the stack by the exterior winding described herein. In one preferred embodiment, the filaments within the cable are not fused to one another, but rather are secured in intimate contact with one another via the external winding surrounding the stack. Preferably, the winding is sufficiently taught to ensure that the level of contact resistance between the adjacent filaments is consistent and uniform, and is below about 10 $\mu\Omega cm^2$, and more preferably below about 5 $\mu\Omega cm^2$, and most preferably below about 1 $\mu\Omega cm^2$.

Figure 3B:
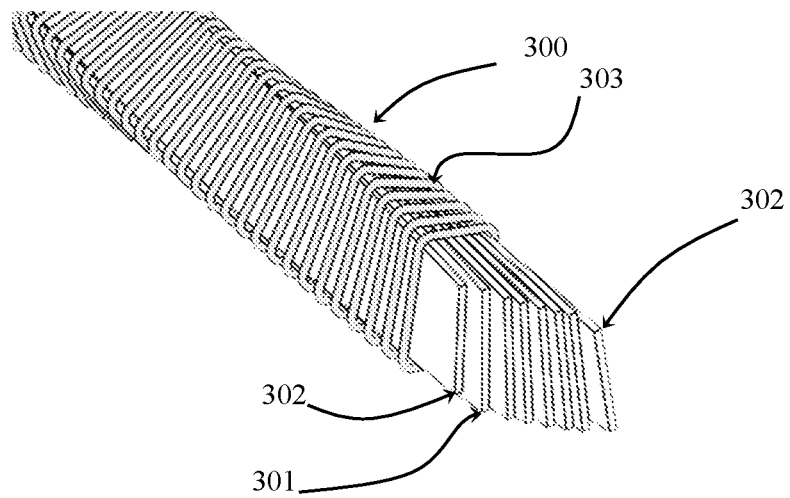
FIG. 3B is an illustrative view of the cable shown in FIG. 3A after twisting.
Figure 3C:
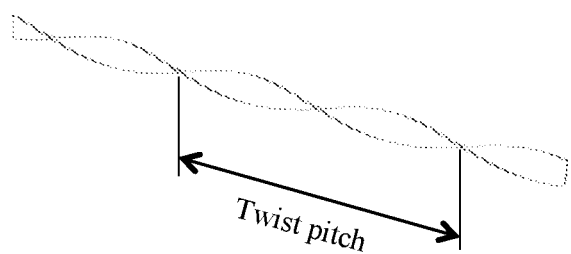
FIG. 3C is an illustration showing the twist pitch of the cable of FIG. 3B.

FIG. 3B illustrates the assembled structure, i.e., cable 300, after twisting. The twisting pitch is chosen so that the strain limit of the YBCO layer is not exceeded. For a 2 mm wide cable, the twisting pitch is preferably from about 5 mm to about 80 mm (see FIG. 3C). For narrower strips, the twisting pitch can be even tighter. For example, the twisting pitch for a cable formed from 1 mm wide filaments can be as tight as 2 mm. The stacked filaments are also subjected to a tensile force during the twisting step. This "drawing" of the filaments during twisting ensures that all the filaments in the stack are under the same tension, and prevents/limits any bulging of the stack. In one preferred embodiment, the tension force is on the order of about 10 N.

Figure 4:
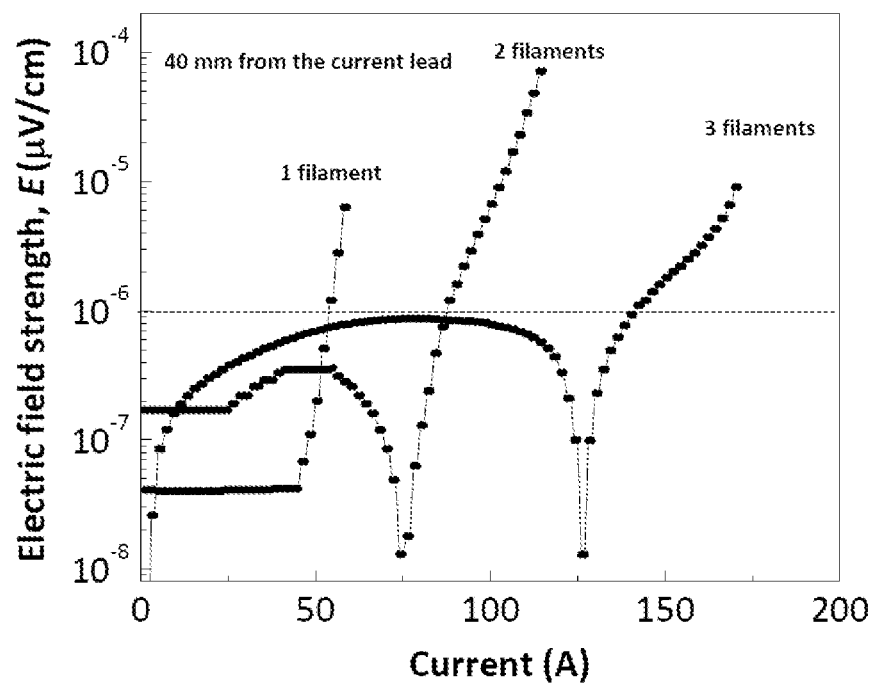
FIG. 4 shows the current-voltage curves of one filament, two filament and three filament cable coupons.

FIG. 4 shows current-voltage curves of a single 2 mm wide exfoliated filament, a cable comprised of two filaments and of three filaments. A proportional enhancement of the critical current density of the stack was observed.

Figure 5A:
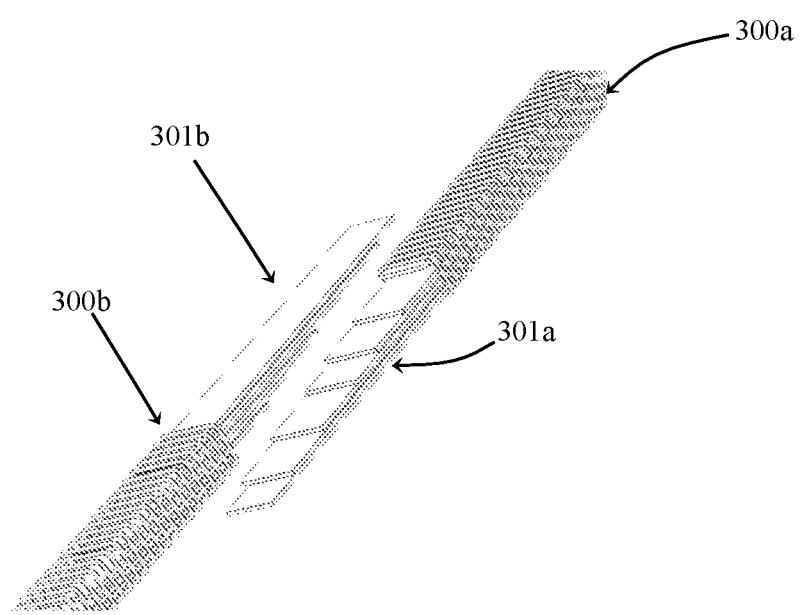
FIG. 5A is an illustrative view of a cable splice formed by positioning an end of a first HTS cable with step-like trimmed filaments into intimate contact with an end of a second HTS cable with corresponding step-like trimmed filaments.
Figure 5B:
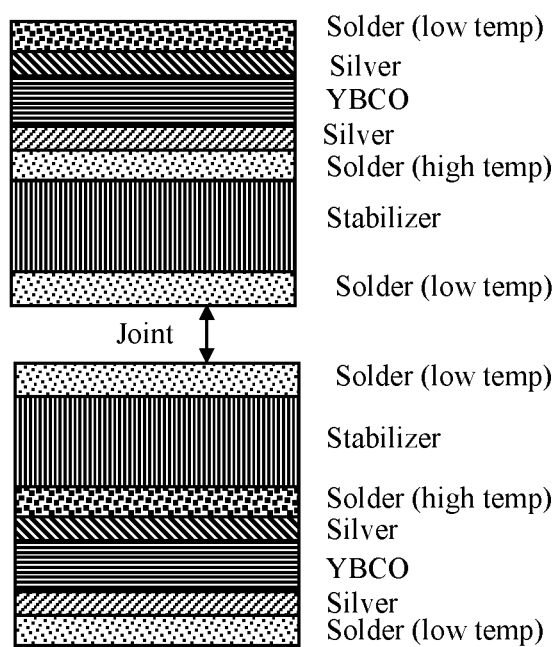
FIG. 5B is an enlarged cross-sectional view through one of the spliced filaments.

A cable splice is illustrated in FIG. 5A. The cable splice is accomplished by trimming the exfoliated filaments 301a of HTS cable 300a in a step-like configuration, and by trimming the exfoliated filaments 301b of HTS cable 300b in a corresponding step-like configuration. As such, the exposed surface of each filament in the first HTS cable electrically contacts the exposed surface of the filament in the second HTS cable. Preferably, the stabilizing metal layers of each filament are exposed, such that the stabilizing metal layers of filaments 301a engage the stabilizing metal layers of filaments 301b when cable 300a is spliced to cable 300b (because the YBCO-silver interface on the stabilizer side of the superconducting layer has lower resistivity as compared to the other side of the superconducting layer). This is because the YBCO-silver interface on the stabilizer side is annealed before exfoliation at a temperature exceeding 400° C., a process which is known to deliver very low contact resistance at the YBCO-silver interface. The silver layer deposited on the other side of the YBCO layer after exfoliation is annealed at a temperature not exceeding the melting temperature of the solder used to attach the stabilizer to the YBCO layer. The melting temperature of the solder used to attach the stabilizer is typically 200° C. Thus, the silver deposited on the other side of the YBCO layer after exfoliation must be annealed at a temperature below 200° C., which results in greater contact resistance of that surface. The spliced filaments can be secured together via low temperature solder and/or external winding of the splice. A cross-sectional view through one of the spliced filaments is shown in FIG. 5B. Both a high temperature solder, such as Pb64Sn34Ag2, used to bond the stabilizing metal layer to the superconducting layer and the low temperature solder used to fuse adjacent filaments are shown in FIG. 5B.

The use of exfoliated filaments to create a multi-filament superconducting cable provides an improved fill factor (useful cross-section occupied by the superconductor). This is because the substrate and buffer layers, which account for the majority of the original HTS tape, are removed via exfoliation. The resultant structure provides improved flexibility, thus allowing for a smaller pitch period when twisted, and for a smaller bending radius when winding magnets.

Figure 6A:
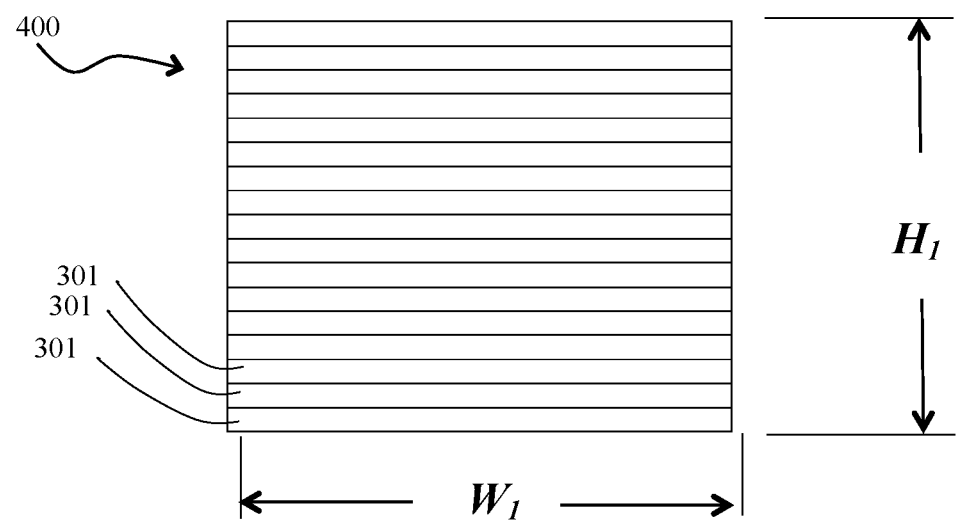
FIG. 6A is a cross-sectional view through a stack of filaments where the height of the stack is substantially equal to the width of the filaments to define a substantially square cross-section.

In another embodiment (as shown in FIG. 6A), filaments 301 are stacked such that the height $H_1$ of stack 400 is substantially equal to the width $W_1$ of the individual filaments. As such, the resultant stack 400 of filaments 301 defines a substantially square cross-section. The filaments in stack 400 may be soldered to one another and/or wrapped with a wire or thread as described hereinabove. In certain applications, stack 400 may be twisted as described hereinabove. In other applications, the twisting of stack 400 may be unnecessary or undesirable. In still other applications, material may be removed from the outer edges of stack 400 (via a cutting tool) to provide a stack with a substantially circular cross-section which may be desirable in certain applications.

Figure 6B:
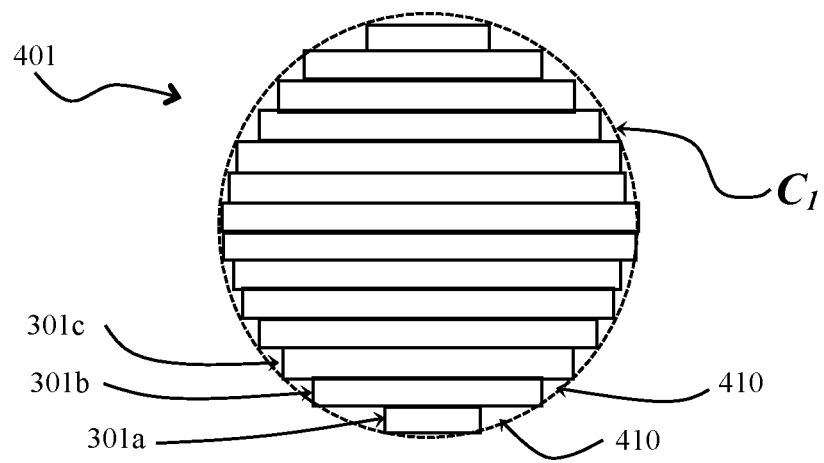
FIG. 6B is a cross-sectional view through a stack of filaments where the width of the filaments is varied to define a substantially circular cross-section.

In another embodiment (as shown is FIG. 6B), the width of the filaments is varied to provide a stack 401 defining a substantially circular cross-section $C_1$. For example, the width of filament 301c>301b>301a. Filaments 301a, 301b and 301c can represent discreet filaments or they may represent a pre-assembled stack of individual filaments of common width. The filaments in stack 401 may be soldered to one another and/or wrapped with a wire or thread as described hereinabove. In one particularly preferred embodiment, the step-shaped gaps 410 surrounding the circumference of stack 401 are filled with solder, either by dipping/coating of the stack prior to winding or by flow of the solder from between the individual filaments during the subsequent heating step. In certain applications, stack 401 may be twisted as described hereinabove. In other applications, the twisting of stack 401 may be unnecessary or undesirable.

Despite the advances that have been made in current HTS manufacturing processes, today's HTS tapes still contain defects which can adversely affect the current carrying capacity of the tape. Traditionally, when a defect is identified by an in-line quality control method, such as TapeStar (product of Theva GMBH), the defect is cut out of the tape and a defect-free portion is spliced therein. This method is practical only for tapes wider than 4 mm. It has been discovered herein that the stacking of exfoliated HTS filaments as described herein addresses the issue of manufacturing defects in today's HTS tapes, particularly in tapes having a width of less than 10 mm, and more particularly, in tapes having a width of less than 4 mm. The present disclosure allows a HTS cable capable of carrying a designated level of current to be readily designed. First, the average defect percentage for a known width/length of a selected HTS tape is estimated and/or calculated based on existing manufacturing data. The filament stack can tolerate defects that are spaced further than the current transfer length, which is 1-2 cm in the examples disclosed herein. Next, the allowable cable dissipation is calculated using the known inter-filament resistivity and the expected defect density. The dissipation level per a defect, Q, can be calculated using the formula, $Q=I_f^2 \times R_s/(w \times \lambda)$, where $I_f$ is the filament current, $R_s$ is the arial contact resistance, $w$ is the filament width and $\lambda$ is the current transfer length. Thereafter, the number of individual superconducting filaments is calculated to provide the necessary cross-sectional area for carrying the current. Finally, the number of individual superconducting filaments is adjusted (e.g., increased) per statistical analysis based on the known defect percentage in HTS tape of that width/length to ensure that the resultant HTS cable is capable of carrying the designated level of current without risk. Using this approach, an operating safety factor can easily be designed into the cable. The minimum number of individual superconducting filaments for a particular application can also be readily calculated.

The illustrative embodiments described herein are not meant to be limiting. Other embodiments may be utilized, and other changes may be made, without departing from the spirit or scope of the subject matter presented here. It will be readily understood that the aspects of the present invention, as generally described herein and illustrated in the figures can be arranged, substituted, combined, and designed in a wide variety of different configurations, all of which are explicitly contemplated and made part of this disclosure.

EXAMPLES

Example 1

A 10 mm wide HTS tape (AMSC Corp Amperium tape) was exfoliated to provide a high-temperature superconducting layer of YBCO materials secured to a 50 µm thick stabilizing metal layer of copper. The exfoliated tape was sliced into 2 mm filaments using a 150 W $CO_2$ laser (Kern Lasers HSE model). The filaments (301 in FIG. 3A) were stacked, and a 100 µm thick, 2 mm wide stainless steel foil was positioned at the top and bottom of the stack (302 in FIG. 3A). The stack was wrapped with an AWG 32 tinned copper wire (303 in FIG. 3A) using a wire wrapping machine (ACME Mechatronics). The wrap speed and the tape advance were matched to provide a 1 mm wire wrap pitch. The exfoliated filaments were coated with a low-temperature solder (Sn62Pb36Ag2) prior to stacking. The low temperature solder layer was less than 20 µm. A tension force of approximately 10 N was applied to the stack during twisting. The stack was then subjected to a temperature of 200° C. for approximately 5 minutes to melt the low temperature solder, thereby fusing the individual filaments to one another.

Example 2

Figure 7:
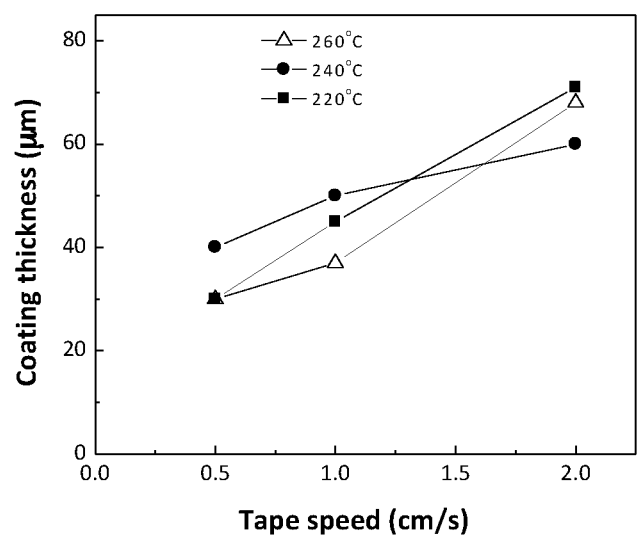
FIG. 7 is a graphical representation of coating thickness vs. tape speed for sample exfoliated filaments.
Figure 8A:
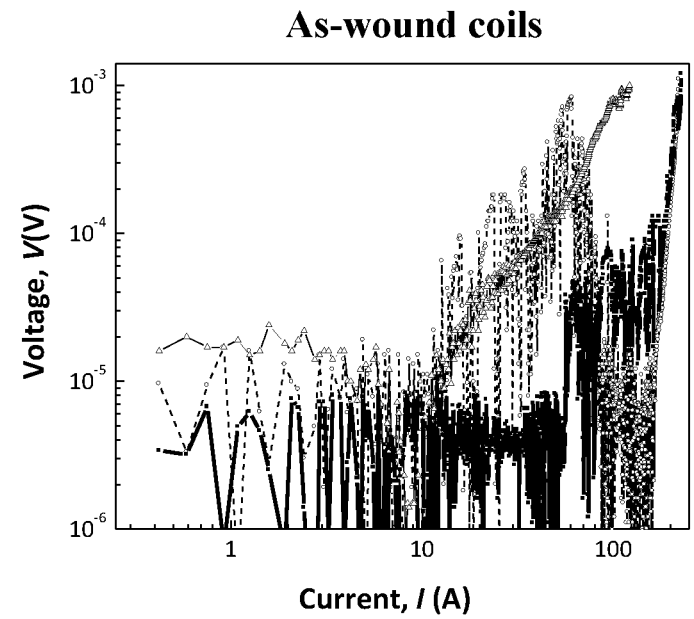
FIG. 8A is a graphical representation of voltage vs. current for a sample cable.
Figure 8B:
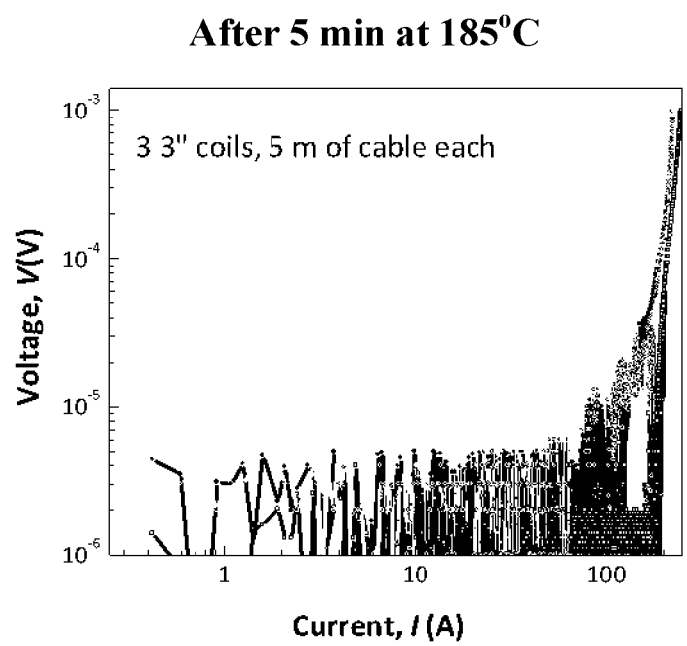
FIG. 8B is a graphical representation of voltage vs. current for the sample cable of FIG. 8A after annealing of the sample.

A 10 mm wide YBCO tape was exfoliated to provide a 1 µm thick YBCO layer secured to a 10 mm wide, 75 µm thick copper foil. The exposed YBCO face was coated with 1 µm of silver by magnetron sputtering. The combined YBCO layer/copper foil was then sliced into 2.4 mm wide filaments using a 200 W $CO_2$ laser. After slicing, the filaments were coated with 62Sn 36Pb 2Ag solder using a dip coating method. Briefly, the filaments were immersed in a bath or organic acid flux, Kester 2331-ZX, and transported into a bath of molten solder kept at a constant temperature 240° C. FIG. 7 shows the effect of the filament linear advance speed on the solder coating thickness. In this example, we used 1 cm/s linear speed, which delivered a coating having a thickness of approximately 20 µm on each side of the filament, thus the total added thickness of the coating was approximately 40 µm. The 2.4 mm wide exfoliated filaments were assembled into a 4-layer stack in a cabling machine. The stack was then clad with a 50 µm thick 316 L stainless steel foil on both sides to provide mechanical protection. The whole stack (~500 µm thick) was then wrapped with a AWG 40 nichrome wire at a 2 mm pitch to ensure uniform mechanical contact between the filaments in the stack, thereby providing a cable. Several 3" diameter coils were manufactured from 5 m long coupons of the cable. After winding, the critical current of the coil was measured at 77 K using the standard 4-point transport method; the voltage tap was placed at 2 cm distance from the current lead. FIG. 8A shows the current-voltage curves of as-wound coils. As-wound coils exhibited unpredictable current-voltage characteristics, as witnessed by voltage jumps and reduced critical current density. The coils were subsequently heated in a low-temperature oven at 185° C. for 10 minutes in order to partially melt the solder and electrically connect the filaments. The current-voltage characteristics of the coils after the heat-treatment exhibited a marked improvement. The voltage spikes were practically absent and the critical current of three coils was within 10% of each other (see FIG. 8B). This experiment demonstrates the improved stability due to current sharing in the electrically-coupled filaments.

Example 3

Figure 9:
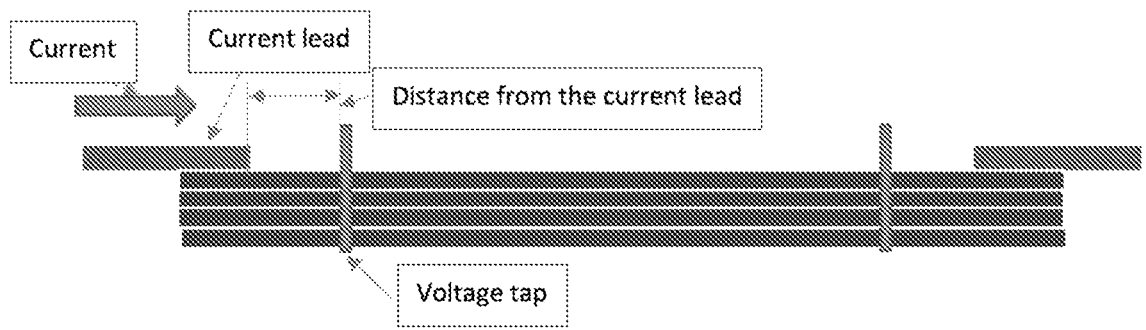
FIG. 9 is a schematic depiction of the voltage vs. current measuring experiment, showing location of voltage and current leads.
Figure 10A:
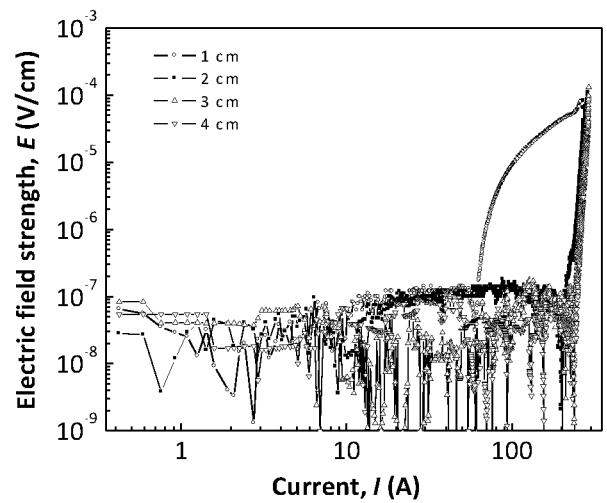
FIG. 10A is a graphical representation of the electric field strength vs. current for a sample HTS cable.
Figure 10B:
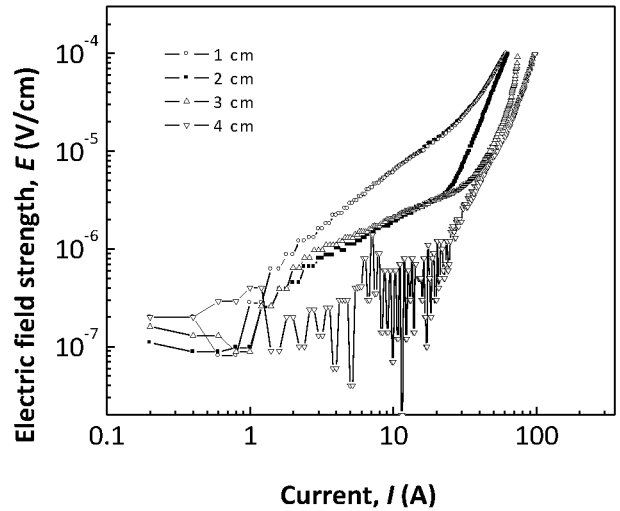
FIG. 10B is a graphical representation of the electric field strength vs. current for a conventional HTS tape.
Figure 11:
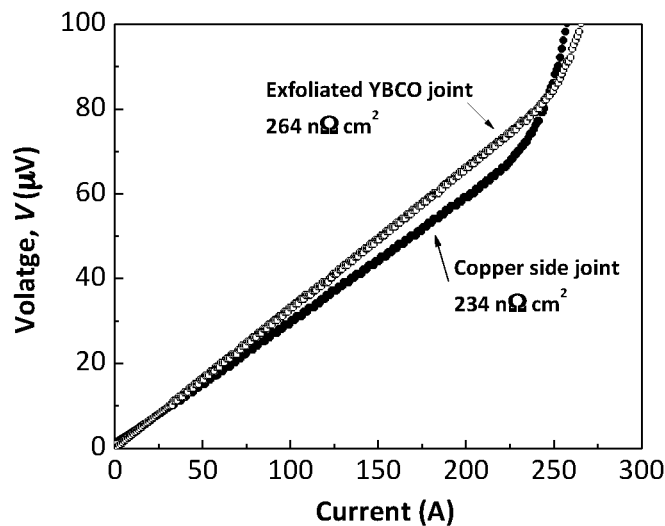
FIG. 11 is a graphical representation of voltage vs. current for sample exfoliated YBCO joints.
Figure 11:
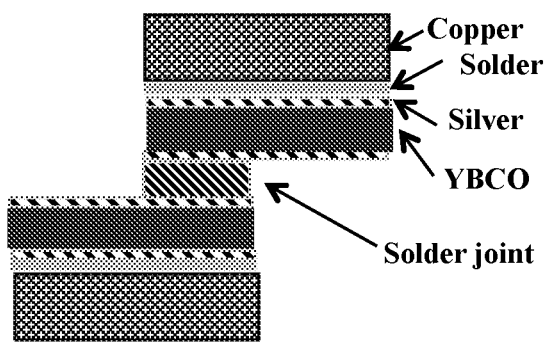
Figure 11:
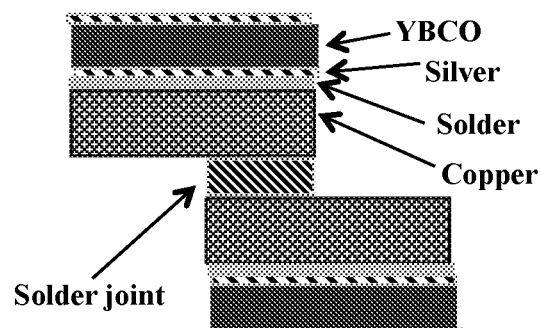

The filament connectivity was tested in a current transfer length experiment, schematically shown in FIG. 9. Briefly, current was injected from one side of the filament stack and the current-voltage characteristics were recorded with the voltage probe placed at various distances from the current injection point. One would expect the current-voltage characteristics to stop changing once the voltage taps are sufficiently far away from the current injection point. The theory of current transfer between the normal metal and a high-temperature superconductor was developed by Levin et al. (Levin, G., P. Barnes, and J. Bulmer, *Current sharing between superconducting film and normal metal*. Superconductor Science and Technology, 2007. 20(8): p. 757). It was shown that the current transfer length, L, depends on the areal resistance, $R_s$, between the normal metal and the superconductor as $L \sim R_s^{1/2}$. Thus, the smaller the resistance between the superconducting filaments, the shorter is the current transfer length. FIG. 10 compares current-voltage characteristics of a 4-layer exfoliated cable with a 4-layer cable manufactured from standard $2^{nd}$ generation tape. The standard $2^{nd}$ generation tape incorporates an insulation substrate that prevents an effective current sharing between the filaments. The 4-layer exfoliated filament stack exhibits full current sharing at a distance of approximately 2 cm from the current injection point (see FIG. 10A). In contrast, the traditional 2G stack does not achieve current sharing even at a distance of 4 cm from the current lead (see FIG. 10B). The resistance between the exfoliated layers was measured by joining two pieces of 10 mm wide tape. The tapes were joined at the "copper side" and at the "YBCO side" as shown in FIG. 11. The figure shows that the exfoliated layers have the same surface resistivity on both sides. In contrast, the traditional 2G has very high resistance due to the current blocking action of the substrate. For example, measurements by Dong et al. (Dong Keun, P., et al., Analysis of a Joint Method Between Superconducting YBCO Coated Conductors. Applied Superconductivity, IEEE Transactions on, 2007. 17(2): p. 3266-3269) show that the contact resistance of two tapes joined by the substrate side is 25 times higher than the resistance of the tapes joined by the YBCO side.

What is claimed is:

1. A multi-filament high temperature superconducting cable, comprising: a plurality of stacked exfoliated filaments, each of said filaments including a superconducting layer and a stabilizing metal layer in the absence of a substrate layer and a buffer layer, and wherein the adjacent stacked filaments are maintained in uniform mechanical contact with each other to allow the uninterrupted flow of current from the superconducting layer of one filament to the superconducting layer of an adjacent layer, and wherein said uniform mechanical contact provides a level of contact resistance between adjacent stacked filaments of less than about 10 $\mu\Omega cm^2$.

2. The cable according to claim 1, wherein the level of contact resistance between adjacent stacked filaments is below about 1 $\mu\Omega cm^2$.

3. The cable according to claim 2, wherein the level of contact resistance between adjacent stacked filaments is below about 0.01 $\mu\Omega cm^2$.

4. The cable according to claim 1, wherein said stacked filaments are preferably twisted along the length thereof.

5. The cable according to claim 4, wherein the twisting pitch is from about 5 mm to about 80 mm.

6. The cable according to claim 1, wherein said stacked filaments are externally wrapped to secure each of said filaments to one another.

7. The cable according to claim 6, wherein said stacked filaments are wrapped with a copper, nichrome or stainless steel wire or a synthetic thread.

8. The cable according to claim 1, wherein said stacked filaments are soldered to one another.

9. The cable according to claim 8, wherein said stacked filaments are soldered to one another with a low temperature solder, and wherein said solder has a thickness of less than approximately 20 µm.

10. The cable according to claim 1, wherein the width of each of said filaments is substantially constant and ranges of from about 0.1 mm to about 3 mm.

11. The cable according to claim 10, wherein the height of said stacked filaments is substantially equal to the width of said filaments to provide a stack having a substantially square cross-section.

12. The cable according to claim 1, wherein the width of said filaments is varied to provide a stack having a substantially circular cross-section.

13. The cable according to claim 1, wherein a first metal foil is positioned on the top of said stacked filaments and a second metal foil is positioned on the bottom of said stacked filaments.

14. The cable according to claim 1, wherein a first metal foil is positioned on the top of said stacked filaments and a second metal foil is positioned on the bottom of said stacked filaments, and wherein said stacked filaments are externally wrapped to secure each of said filaments to one another, and wherein said stacked filaments are preferably twisted along the length thereof, and wherein said stacked filaments are soldered to one another.

\* \* \* \* \*